United States Patent
Gao

(10) Patent No.: US 11,963,337 B2
(45) Date of Patent: Apr. 16, 2024

(54) CONTACTLESS DEVICE AND CHIP THERMAL MANAGEMENT PLATE

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 221 days.

(21) Appl. No.: 17/700,850

(22) Filed: Mar. 22, 2022

(65) Prior Publication Data
US 2023/0309269 A1    Sep. 28, 2023

(51) Int. Cl.
H05K 7/20    (2006.01)

(52) U.S. Cl.
CPC ..... *H05K 7/20772* (2013.01); *H05K 7/20272* (2013.01)

(58) Field of Classification Search
CPC . H01L 23/4735; H05K 7/20236; H05K 7/203
See application file for complete search history.

(56) References Cited

U.S. PATENT DOCUMENTS

| | | | | |
|---|---|---|---|---|
| 5,021,924 A * | 6/1991 | Kieda | ........... | H01L 23/4336 361/698 |
| 5,270,572 A * | 12/1993 | Nakajima | ........... | H01L 23/4735 361/689 |
| 6,108,201 A * | 8/2000 | Tilton | ........... | H05K 7/20345 361/689 |
| 6,595,014 B2 * | 7/2003 | Malone | ........... | F28D 15/06 361/699 |
| 6,817,196 B2 * | 11/2004 | Malone | ........... | H01L 23/4735 361/699 |
| 6,955,062 B2 * | 10/2005 | Tilton | ........... | H05K 7/20345 361/699 |
| 7,104,078 B2 * | 9/2006 | Tilton | ........... | H01L 23/4735 62/171 |
| 7,885,070 B2 * | 2/2011 | Campbell | ........... | H05K 7/20809 361/698 |
| 7,944,694 B2 * | 5/2011 | Campbell | ........... | H05K 7/20809 174/15.1 |
| 7,983,040 B2 * | 7/2011 | Campbell | ........... | H05K 7/20236 174/15.1 |

(Continued)

FOREIGN PATENT DOCUMENTS

CN    113543588 B  *  6/2022    ......... H05K 7/20836

*Primary Examiner* — Robert J Hoffberg
(74) *Attorney, Agent, or Firm* — WOMBLE BOND DICKINSON (US) LLP

(57) ABSTRACT

A cooling device includes a frame structure housing an internal channel and an inlet port coupled to the frame structure. The inlet port is to receive a coolant fluid and to direct the coolant fluid to the internal channel. The cooling device includes one or more contactless cooling ports disposed on the frame structure and at a predetermined distance from an electronic chip. A contactless cooling port accelerates a stream of coolant fluid across a surface of the electronic chip to transfer heat from the electronic chip to the stream of coolant fluid. The cooling device includes a separator for segregating and diverging streams of coolant fluid. The cooling device includes a mounting structure secured to the frame structure, where the mounting structure is mounted to a server chassis or a server board.

18 Claims, 8 Drawing Sheets

(56) References Cited

U.S. PATENT DOCUMENTS

| | | | | |
|---|---|---|---|---|
| 8,120,908 | B2* | 2/2012 | Arik | G06F 1/20 |
| | | | | 361/679.48 |
| 8,184,436 | B2* | 5/2012 | Campbell | H05K 7/203 |
| | | | | 361/701 |
| 8,305,759 | B2* | 11/2012 | Attlesey | H05K 7/20772 |
| | | | | 165/80.4 |
| 8,550,372 | B2* | 10/2013 | Shedd | H01L 23/4735 |
| | | | | 239/66 |
| 11,071,238 | B2* | 7/2021 | Edmunds | H01L 23/4735 |
| 11,737,247 | B2* | 8/2023 | Edmunds | H05K 7/203 |
| | | | | 361/699 |
| 11,778,790 | B2* | 10/2023 | Edmunds | H05K 7/20236 |
| | | | | 361/679.46 |
| 2005/0183844 | A1* | 8/2005 | Tilton | H01L 23/4735 |
| | | | | 165/80.4 |
| 2020/0390007 | A1* | 12/2020 | Edmunds | H05K 7/20272 |
| 2023/0010253 | A1* | 1/2023 | Balachandar | B05B 1/02 |

* cited by examiner

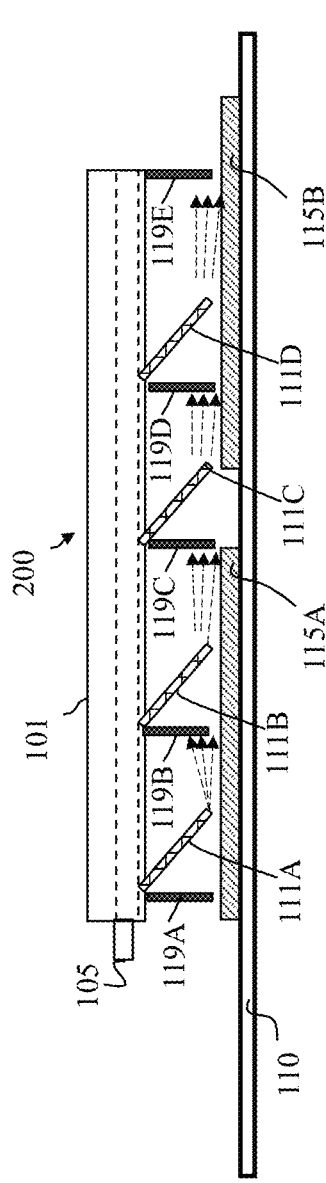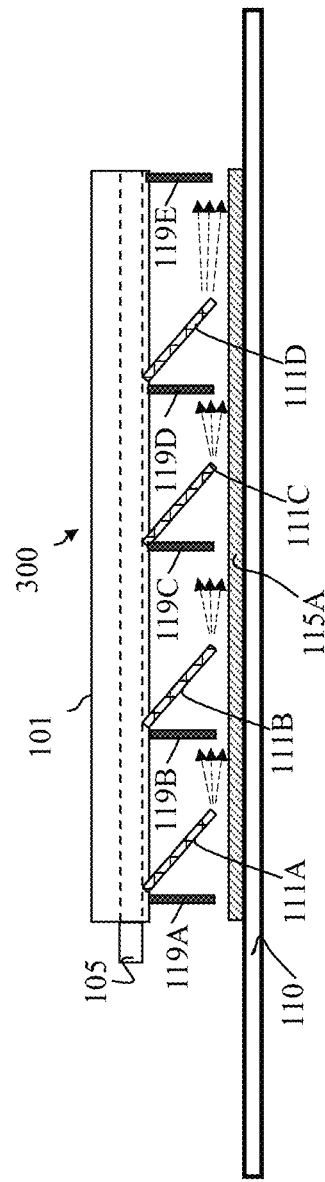

CONTACTLESS DEVICE AND CHIP THERMAL MANAGEMENT PLATE

FIELD OF THE INVENTION

Embodiments of the present invention relate generally to data center and energy storage system cooling. More particularly, embodiments of the invention relate to a contactless device and chip thermal management plate.

BACKGROUND

Thermal management for a data center that includes several active electronic racks is critical to ensure proper performance of servers and/or other IT equipment (e.g., performing IT services) that is operating in the racks. Without proper thermal management, however, the thermal environment (e.g., temperature) within the racks may exceed thermal operational thresholds, which may result in adverse consequences (e.g., servers failing, etc.). One way to manage the thermal environment is the use of cooling air to cool the IT equipment. The cooling air is recirculated through cooling units. Heat generated by the IT equipment is captured by the cooling air and is extracted by the cooling unit.

Recently, data centers have been deploying high-power density electronic racks, where a large quantity of high-density chips are packaged closer together to provide more computing power. Cooling these high-density racks by maintaining a proper thermal environment may be an issue with existing cooling systems, such as a computer room air conditioning (CRAC) unit. For instance, although the CRAC unit may maintain the thermal environment with more conventional (or lower-density) racks, the unit may be unable to effectively cool high-power density racks because they may generate heat load at a higher rate due to the higher density electronics. Or significant cost may be needed for upgrading a CRAC system to satisfy a cooling requirement of a high density deployment. Another challenge for air cooling high density racks is moving a large amount of airflow sufficient to cool the racks. Since heat removal capacity of fluid is much larger than heat removal capacity of air, thus it is more economical to move cooling fluid for cooling. Therefore, designing the cooling fluid closer to the IT, indirectly or directly in contact with electronics are an effective mean.

Immersion cooling, which involves at least partially submerging electronics in a non-conductive dielectric solution, is a feasible solution for high-density electronics. Existing solutions for immersion cooling only considers fluid recirculation for an electronic rack without local cooling acceleration. Heterogeneous electronic components that can give rise to predictable hot spots with immersion cooling. Therefore, there is a need for local cooling acceleration to accommodate hot spots for different electronic hardware, chips, and configurations.

BRIEF DESCRIPTION OF THE DRAWINGS

Embodiments of the invention are illustrated by way of example and not limitation in the figures of the accompanying drawings in which like references indicate similar elements.

FIG. 2 is a block diagram illustrating a side view of a modified cooling device for different chip or server board arrangements according to one embodiment.

FIG. 3 is a block diagram illustrating a side view of another modified cooling device for different chip or server board arrangements according to one embodiment.

DETAILED DESCRIPTION

Figure 1A:
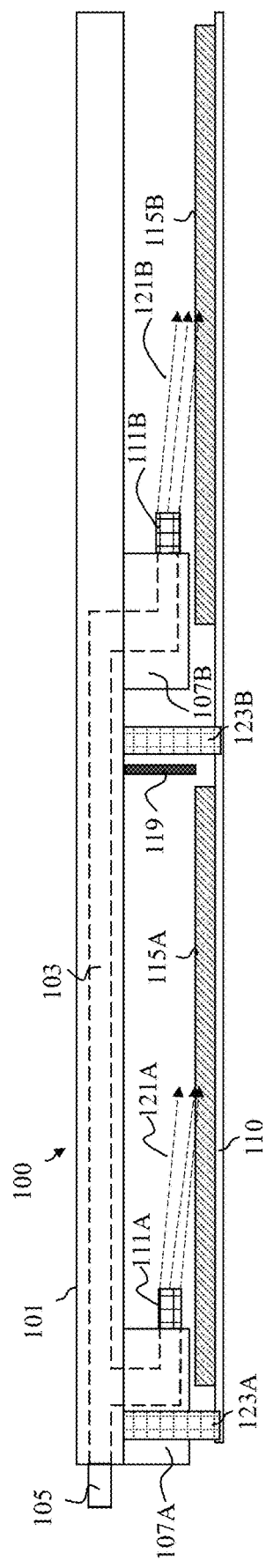
FIG. 1A is a block diagram illustrating a side view.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

The current work proposes a contactless cooling plate design for high power density chips. The cooling plate can be placed adjacent to a high power density chip to provide a coolant fluid stream to the high power density chip without contacting the high power density chip.

According to a first aspect, a cooling device includes a frame structure housing an internal channel and an inlet port coupled to the frame structure and the inlet port is to receive a coolant fluid and to direct the coolant fluid to the internal channel. The cooling device includes one or more contactless cooling ports disposed on the frame structure at a predetermined distance from an electronic chip, where a contactless cooling port is to accelerate a stream of coolant fluid across a surface of the electronic chip to transfer heat from the electronic chip to the stream of coolant fluid. The cooling device includes a mounting structure coupled to the frame structure, where the mounting structure is mounted on a server chassis housing a server board or is mounted on the server board.

In one embodiment, the cooling device includes one or more fluid distributors coupled to the frame structure to receive the coolant fluid from the internal channel of the frame structure and the one or more contactless cooling ports are disposed on the one or more fluid distributors.

In one embodiment, the cooling device includes a fluid separator separating a first fluid distributor from a second fluid distributor segregating two streams of coolant fluid.

In one embodiment, the frame structure is mountable on a server chassis housing the server board having a number of electronic chips disposed thereon.

In one embodiment, during operation, the server chassis is oriented with the inlet port near a bottom portion of an immersion tank and the accelerated coolant fluid stream rises to a top portion of the immersion tank.

In one embodiment, the one or more cooling ports directs a stream of cooling fluid horizontal to the surface of the electronic chip, where a cooling port is disposed at a predetermined height and at a predetermined distance to an edge of the electronic chip such that the stream of cooling fluid begins at the side of the electronic chip and flows over an entire surface of the electronic chip.

In one embodiment, the one or more cooling ports directs a stream of cooling fluid at an angle between 30-60 degrees to the surface of the electronic chip, where a cooling port is disposed at a predetermined height and at a predetermined distance to an edge of the electronic chip such that the stream of cooling fluid at the angle begins at the side of the electronic chip and flows over an entire surface of the electronic chip.

In one embodiment, the coolant fluid stream is accelerated towards a fluid separator and the coolant fluid stream merges with immersion coolant in an immersion tank from side spacings that are between the server chassis and the server board.

In one embodiment, the cooling device includes a pump coupled to the inlet port to pump coolant fluid from the inlet port to the internal channel.

In one embodiment, the coolant fluid is an immersion fluid in an immersion tank, where the server chassis is submerged in the immersion fluid.

In one embodiment, a fluid separator is integrated to a side panel of a first fluid distributor and is used to separate the stream of coolant fluid from another stream of coolant fluid of a second fluid distributor.

According to a second aspect, a cooling system includes a server chassis housing a server board therein and the server chassis to contain an immersion coolant and one or more cooling devices secured in the server chassis. Each cooling device includes a frame structure housing an internal channel and an inlet port coupled to the frame structure and the inlet port is to receive a coolant fluid and to direct the coolant fluid to the internal channel. The cooling device includes one or more fluid distributors coupled to the frame structure to receive the coolant fluid from the internal channel of the frame structure, and one or more contactless cooling ports coupled to each of the one or more fluid distributors, each of the one or more contactless cooling ports being disposed at a predetermined distance from an electronic chip, wherein a contactless cooling port is to accelerate a stream of coolant fluid across a surface of an electronic chip to transfer heat from the electronic chip to the stream of coolant fluid. The cooling device includes a mounting structure secured to the frame structure, where the mounting structure is mounted on to the server chassis or the server board.

Figure 1B:
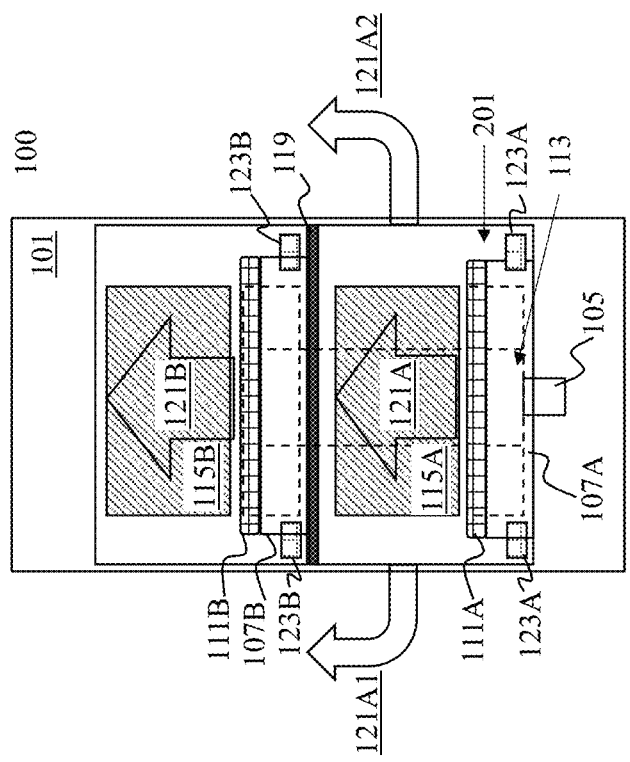
FIG. 1B is a block diagram illustrating a top view.

FIG. 1A is a block diagram illustrating a side view of a cooling device 100 attached onto a server printed circuit board (PCB) board (or server board) 110 according to one embodiment. In this example, server board 110 includes two high power density chips 115A-115B. In one embodiment, cooling device 100 includes a frame structure 101 having an internal channel 103 therein. Frame structure 101 can be a rigid structure with composition of aluminum, stainless steel metal, or the like. Cooling device 100 includes inlet port 105 coupled to one end of frame structure 101. Inlet port 105 has a port opening to receive a coolant fluid to internal channel 103. Cooling device 100 includes one or more fluid distributors 107A-107B. One or more cooling ports 111A-111B are attached to the fluid distributors 107A-107B. In one embodiment, fluid distributors 107A-107B has a hollow body that interfaces with internal channel 103 and fluid distributors 107A-107B distribute the coolant fluid from the internal channel 103 to the cooling ports 111A-111B. Fluid distributors 107A-107B can be a rigid structure with composition of aluminum, stainless steel metal, or the like. Cooling ports 111A-111B can be attached onto frame structure 101 of the cooling device 100 or to the fluid distributors 107A-107B. Cooling ports 111A-111B is located on a side and at a predetermined distance (such as, approximately 2 mm to 10 mm) to chips 115A-115B. In one embodiment, cooling ports 111A-111B are elevated from chips 115A-115B by a predetermined distance (such as, approximately 5 mm to 15 mm) to providing a stream of coolant fluid directly to a surface of chips 115A-115B. In one embodiment, cooling ports 111A-111B are horizontally aligned to chips 115A-115B. Cooling device 100 can include extendable mounting structures 123A-123B secured to frame structure 101 (e.g., mounting poles that are mounted onto the server board) that can integrate with a server chassis housing server board 110 or can integrate with server board 110. The predetermined distance from cooling ports 111A-111B to chips 115A-115B can be configured by adjusting a height of the extendable mounting structures 123A-123B. In one embodiment, separators 119 are attached to cooling device 100. A separator 119 can be a panel that is attached anywhere on a backside of cooling device 100 to separate the different cooling streams. For example, separator 119 can be attached to an opposite side of chip 115A away from cooling port 111A, to direct cooling stream 121A to flow along the planar surface (also into and out of the page) of chip 115A. Cooling stream 121A can then split into streams 121A1 and 121A2 which exit between gaps formed between server board 110 and cooling device 100, as further shown by the arrows of FIG. 1B. Here, separator 119 can prevent cooling stream 121A (which is heated) from interfering with cooling stream 121B. In another embodiment, a back side of fluid distributors 107A-107B can be used as a separator that separates the cooling streams 121A-121B. Note that cooling streams 121A and 121B are heated and becomes hot streams as shown in FIG. 1B. The separator can segregate the hot streams and divert a stream to the side 121A1 and 121B1.

Although two high density chips 115A-115B and two cooling ports 111A-111B are shown, server board 110 can contain any number of high density chip(s) and cooling device 100 can include any number of cooling port(s) configured to direct cooling streams to the high density chip(s). Although shown as separate elements, distributors 107A-107B and frame structure 101 can be machined as one piece. In another embodiment, distributors 107A-107B can include male grooves and frame structure 101 can include female grooves at the backside along a length of frame structure 101 for the male grooves of the distributors 107A-107B to secure to.

As noted above, the design of cooling device 100 does not include any hardware (thermal plates) in contact with chips 115A-115B. Instead, cooling device 100 is mounted on the server board or the server chassis and a cooling mechanism provided to chips 115A-115B is by directing streams of coolant fluid (or cooling streams) to flow through a surface of chips 115A-115B, thereby, transferring heat from chips 115A-115B to the cooling streams. In one embodiment, the chips may have a die surface directly expose to the ambient and directly in contact with the cooling streams.

Server board and chips can correspond to a server that is configured to provide IT services. Specifically, the server may include a host server (referred to as a host node) and/or one or more compute servers (also referred to as computing nodes, such as CPU server and GPU server). The host server (having one or more CPUs) typically interfaces with clients (not shown) over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. In one embodiment, the server can perform any type of computing task and/or can be any type of computing device (e.g., a server, a storage device, etc.). In one embodiment, the server can be edge computing devices. Thus, while the server provides the IT services, the server generates heat that is transferred to single-phase or two-phase coolant.

FIG. 1B is a block diagram illustrating a top view of cooling device 100 according to one embodiment. As shown in FIG. 1B, cooling device 100 is shown with cooling ports 111A-111B coupled to fluid distributors 107A-107B. In one embodiment, inlet port 105 is coupled to an inlet connector and the inlet connector can be fed by a coolant fluid source. The coolant fluid source can be a dedicated cooling fluid supplied by a data center facility or can be the immersion fluid which a server chassis of the server board is immersed in. In one embodiment, cooling device can include a cooling plate 201. Cooling plate 201 can be viewed as a standalone cooling device if cooling port 111A and/or distributor 107A is directly assembled on cooling plate 201. The dash line 103 represents internal channel 103 which distributes the coolant fluid from inlet port 105 to cooling ports 111A-111B. The coolant fluid is injected from cooling ports 111A-111B and forms cooling streams 121A-121B. Cooling streams 121A-121B are being delivered to the surfaces of chips 115A-115B. In one embodiment, separators 119 are used to separate the cooling streams 121A-121B from the two separate cooling ports to passively manage a flow of the cooling streams.

Figure 1C:
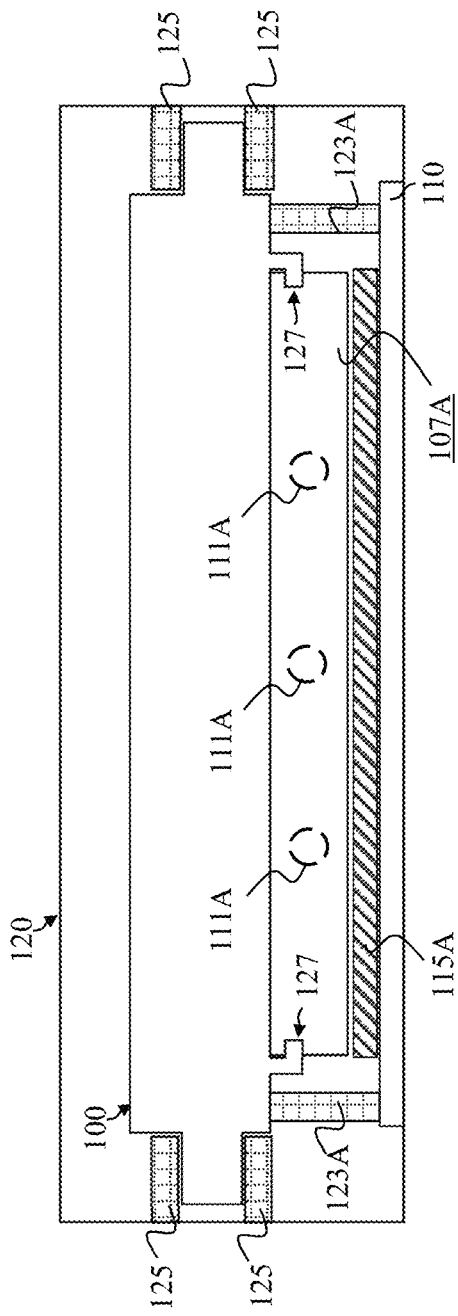
FIG. 1C is a block diagram illustrating a rear view of a cooling device according to one embodiment.

FIG. 1C is a block diagram illustrating a rear view of cooling device 100 according to one embodiment. As shown, frame structure 101 can be mounted to side mounts 125 that are protruding from server chassis 120. In this case, during installation, the protrusions of cooling device 100 can slide into and in between side mounts 125 of server chassis 120. Although shown with side mounts 125 and mounting structures 123A-B, in some embodiments, only side mounts 125 are used to secure cooling device 100 to server chassis 120 or only mounting structures 123A-B are used to secure cooling device 100 to server board 110.

In one embodiment, fluid distributor 107A includes crevices at two distal ends of fluid distributor 107A and frame structure 120 has complementary protrusions 127 for fluid distributor 107A to slide onto frame structure 120 during installations. Similar coupling features can be used for cooling ports/outlets 111A-111B to couple with fluid distributors 107A-107B. In some embodiments, cooling ports/outlets 111A-111B are machined with fluid distributors 107A-107B as a single piece.

FIGS. 2-3 are block diagrams illustrating a side view of modified cooling devices 200, 300 providing cooling for different chip or server board arrangements according to some embodiments. Cooling devices 200, 300 can represent cooling device 100 of FIG. 1A. Because different PCBs have different locations for high power density chips and the different high density chips varies in size and positions for hot spots, cooling devices 200, 300 can be reconfigurable to meet a thermal requirement of a PCB/chips arrangement. As shown in FIG. 2, cooling device 200 has cooling ports 111A-111D attached directly to frame structure 101 of cooling device 200 and cooling device 200 is used to cool multiple chips 115A-115B. As shown, each of cooling ports 111A-111D are mounted at predetermined distances apart from one another to distribute streams of coolant fluid at the predetermined distances. In one embodiment, cooling ports 111A-111D are disposed on the frame structure 101 at a slanted angle between 30-60 degrees at a predetermined height to chips 115A-115B. Although shown as 45-degree angle, each of cooling ports 111A-111D can be configured at other angles to achieve optimal cooling results.

Refer to FIG. 3, cooling device 300 of FIG. 3B has cooling ports 111A-111D that can generate cooling streams to cool multiple chip areas of chip 115A. Cooling devices 200, 300 can include fluid separators 119A-119E that are used to separate the multiple cooling streams generated by cooling ports 111A-111D. In one embodiment, cooling ports 111A-111D are disposed on the frame structure 101 at a slanted angle between 30-60 degrees to generate cooling streams that are between 30-60 degrees to the surface of the chips. In one embodiment, the cooling ports are machined with the fluid separators as a single piece. The co-design of the cooling ports and the fluid separators allows the fluid to be segregated to different cooling areas corresponding to hot spots of the high densities chip(s) and to minimize interferences between the different cooling streams in the different segregated cooling areas. Although shown as 45-degree angle, each of cooling ports 111A-111D can be configured to other angles and height to chips to achieve optimal cooling results.

Figure 4:
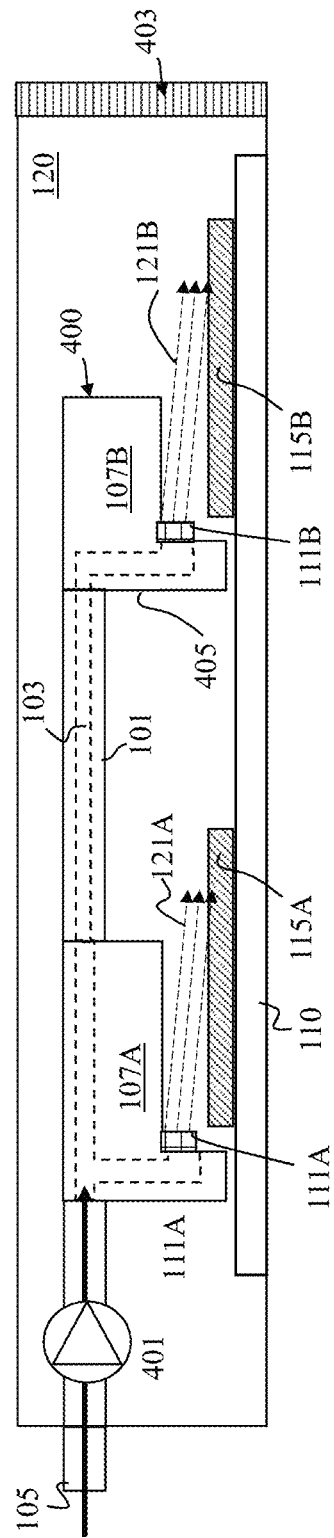
FIG. 4 is a block diagram illustrating a side view of a cooling device with an active pump according to one embodiment.

FIG. 4 is a block diagram illustrating a side view of a cooling device 400 with an active pump according to one embodiment. Cooling device 400 can represent cooling device 100 of FIG. 1A. As shown in FIG. 4, cooling device 400 is disposed on server board 110, where server board 110 is housed in server chassis 120. In one embodiment, cooling device 400 is mounted on server board 110. In another embodiment, frame structure 101 of cooling device 400 is mounted to sides of server chassis 120 through brackets, mounting slots, or the like (not shown). In one embodiment, cooling device 400 can include active pump 401 to pump coolant fluid from inlet port 105 to internal channel 103 of structure 101 for the coolant fluid to build up pressure in internal channel 103. The coolant fluid from internal channel 103 then is directed to fluid distributors 107A-107B that are coupled to frame structure 101. Fluid distributors 107A-107B can direct coolant fluid to individual cooling ports 111A-111B. Cooling ports 111A-111B generates cooling streams 121A-121B, where cooling streams 121A-121B flows across a surface of chips 115A-115B. In one embodiment, cooling ports 111A-111B are configured to be positioned at a predetermined height to chips 115A-115B, and at a predetermined distance to an edge of chips 115A-115B. This way, cooling streams 121A-121B can traverse across an entire surface of chips 115A-115B. In one embodiment, a side panel or separator 405 is integrated to a rear of fluid distributor 107B segregating cooling streams 121A-121B.

The side panel 405 can direct cooling stream 121A to flow to towards the sides/gaps 121A1-121A2 before cooling stream 121A exits server chassis 120. In one embodiment, server chassis 120 includes perforations 403 for coolant fluid to exit server chassis 120.

Note that cooling device 400 does not include any hardware in contact with chips 115A-115B and the main frame structure 101 of cooling device 400 can be attached to the server board 110 or server chassis 120. In one embodiment, a back panel of distributors 107A-107B can function as a fluid separator, e.g., distributor 107B separates cooling stream 121A from cooling stream 121B.

Figure 5:
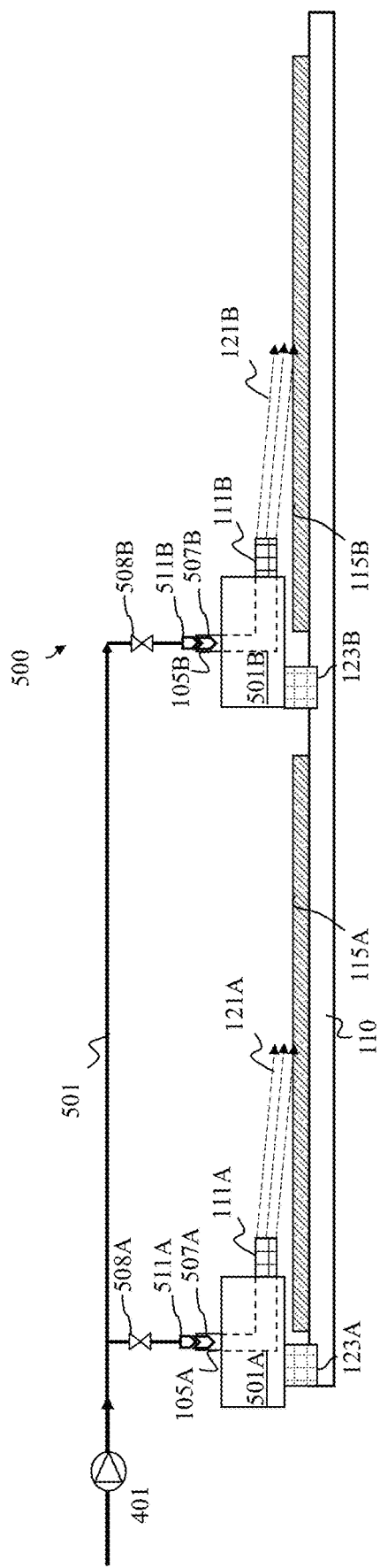
FIG. 5 is a block diagram illustrating a side view of a cooling device coupled to a fluid loop according to one embodiment.

FIG. 5 is a block diagram illustrating a side view of a cooling device 500 coupled to a fluid loop according to one embodiment. Cooling device 500 can represent cooling device 100 of FIG. 1A. As shown in FIG. 5, cooling device 500 can include a cluster of frame structures 501A-501B with respective internal channels to deliver coolant fluid to adjacent chips. Each of the frame structures 501A-501B can be individualized to cool adjacent high power density chips without being in contact with the high power density chips. In one embodiment, frame structures 501A-501B can be fluidly coupled to a system loop 501, which can include tubes, manifold, pipes, or the like. System loop 501 can be actively controlled by pump 401 to deliver coolant fluid to frame structures 501A-501B. Each frame structures 501A-501B can be mounted on a mounting structure 123A-123B (such as an aluminum or stainless steel metal vertical post that can secure a respective frame structure to the server board) and cooling ports 111A-111B are coupled to one side of frame structures 501A-501B to generate cooling streams to the chips 115A-115B. Contactless cooling device 500 can be configured to flexibly scale to cool any number of chips on server boards of various sizes. FIG. 5 provides a chip-level modular design with the same concept. This design provides more flexibility when adding cooling devices to provide cooling streams locally.

In one embodiment, system loop 501 include liquid manifold, pipes, tubes, or hoses, or the like. In one embodiment, system loop 501 includes extension lines that are coupled to respective male connectors 511A-511B. In one embodiment, input ports 105A-105B are coupled to female connectors 507A-507B. Female connectors 507A-507B can interface with the complementary male connectors 511A-511B for fluid coupling. In some embodiments, connectors 507A-507B, 511A-511B are dripless connectors.

In one embodiment, control valves 508A-508B can be disposed on the extension lines to control a flow of coolant liquid to corresponding frame structures 501A-501B. In one embodiment, a temperature sensor disposed near the output ports of each frame structure 501A-501B can be used for controlling the corresponding valves 508A-508B, where the valve open ratio controls a flow rate of coolant fluid to the corresponding frame structure. This control design ensures that a flow rate of cooling stream adapts to each chip's thermal requirement so that the chips would have a same temperature by controlling the flow rate of coolant fluid delivered to the corresponding chips.

Note that the different cooling device designs shown in FIGS. 2-5 illustrate flexibility, adaptability, and scalability of cooling devices 200, 300, 400, and 500 for different board and/or chip configurations.

Figure 6:
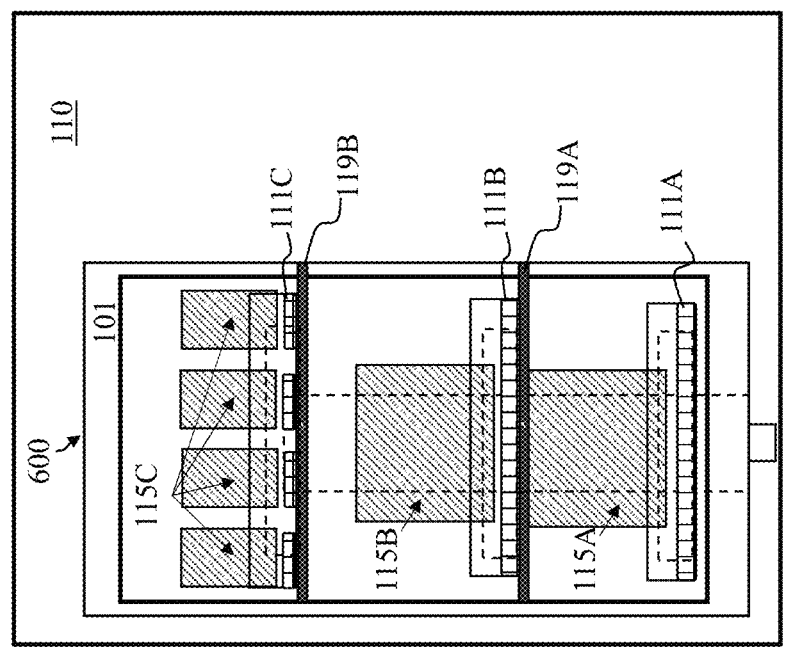
FIG. 6 is a block diagram illustrating a cooling device assembled to a PCB in a chassis according to one embodiment.

FIG. 6 is a block diagram illustrating a cooling device 600 assembled to a PCB in a chassis according to one embodiment. Cooling device 600 can represent cooling device 100 of FIG. 1A. As shown, cooling device 600 is assembled to a PCB server board 110 which includes multiple chips 115A-115C. In an embodiment, the PCB is an artificially intelligent (AI) chips device, on which multiple high power density chips are packaged including the compute dies, memory dies, and so forth. The chips 115A-115C can be in different form factors and can have different power densities. In this scenario, each of chips 115C has a corresponding fluid port 111C that generates a cooling stream to flow over a surface of chips 115C. Here, cooling device 600 can include dedicated cooling ports for different chips or areas of chips.

Figure 7:
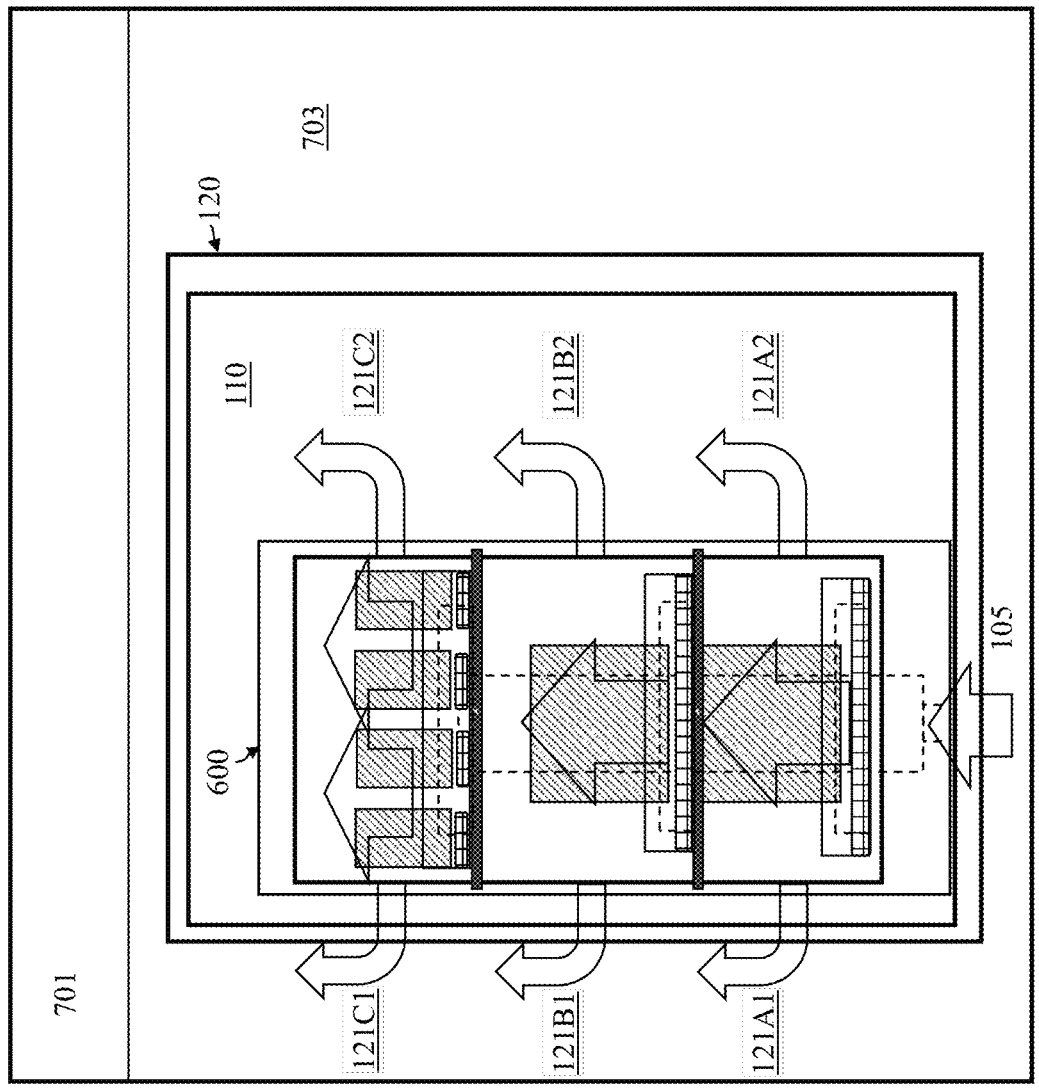
FIG. 7 is a block diagram illustrating a cooling device assembled to a PCB in a chassis immersed in an immersion environment according to one embodiment.

FIG. 7 is a block diagram illustrating a cooling device 600 assembled to a PCB in a server chassis according to one embodiment. The server board 110 is housed in a server chassis 120 and the server chassis 120 is immersed in system enclosure 701. In one embodiment, cooling device 600 is mounted to server board 110 and server board 110 is immersed in system enclosure 701.

In one embodiment, system enclosure 701 includes immersion fluid 703 and immersion fluid 703 can be a mineral oil, dielectric solution, glycol, and so forth. Cooling device 600 can receive the coolant fluid (which can be the same as the immersion fluid 703) and actively distribute the coolant fluid to high thermal regions, e.g., where the chips are located. As shown, server board 110 and contactless cooling device 600 can be orientated such that inlet 105 is near a bottom of system enclosure 701 and is where the coolant liquid enters contactless cooling device 600. The coolant liquid can be direct to separated cooling streams that are separated by separators and the cooling streams are caused to move across surfaces of chips without cooling device 600 being physically in contact with the chips. the cooling streams then transfer heat away from the chips before exiting server board as shown at flows 121A1, 121A2, 121B1, 121B2, 121C1, 121C2 through the gaps between cooling device 600 and server board 110. Here, cooling device 600 is configurable to distribute coolant fluid to the chips on a server board of various configurations and/or sizes to achieve a high flexibility, adaptability, and scalability thermal management solution.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A cooling device, comprising:
    a frame structure containing an internal channel;
    an inlet port coupled to the frame structure configured to receive a coolant fluid and to direct the coolant fluid to the internal channel;
    one or more contactless cooling ports disposed on the frame structure at a predetermined distance from an electronic chip to accelerate a stream of the coolant fluid across a surface of the electronic chip to exchange heat from the electronic chip; and
    a mounting structure secured to the frame structure, wherein the mounting structure is mounted to a server chassis or a server board housed in the server chassis, wherein during operation, the server chassis is oriented with the inlet port near a bottom portion of an immersion tank and the accelerated stream of the coolant fluid rises to a top portion of the immersion tank.

2. The cooling device of claim 1, further comprises one or more fluid distributors coupled to the frame structure to receive the coolant fluid from the internal channel of the frame structure and the one or more contactless cooling ports is disposed on the one or more fluid distributors.

3. The cooling device of claim 2, wherein the one or more fluid distributors comprises a first fluid distributor and a second fluid distributor, and the cooling device further comprises a fluid separator separating the first fluid distributor from the second fluid distributor segregating two of the stream of the coolant fluid.

4. The cooling device of claim 2, wherein the one or more fluid distributors comprises a first fluid distributor and a second fluid distributor, and wherein a fluid separator is integrated to a side panel of the first fluid distributor and is used to separate the stream of the coolant fluid from another stream of the coolant fluid flowing from the second fluid distributor.

5. The cooling device of claim 1, wherein the frame structure is mounted on the server chassis housing the server board, the server board having a plurality of the electronic chip disposed thereon.

6. The cooling device of claim 1, wherein the one or more contactless cooling ports directs the accelerated stream of the coolant fluid parallel to the surface of the electronic chip, wherein a cooling port of the one or more contactless cooling ports is disposed at a predetermined height and at a predetermined distance to an edge of the electronic chip such that the accelerated stream of the coolant fluid begins at the edge of the electronic chip and flows over an entirety of the surface of the electronic chip.

7. The cooling device of claim 1, wherein the one or more contactless cooling ports directs the accelerated stream of the coolant fluid at an angle substantially between 30 to 60 degrees to the surface of the electronic chip, wherein a cooling port of the one or more contactless cooling ports is disposed at a predetermined height and at a predetermined distance to an edge of the electronic chip such that the accelerated stream of the coolant fluid at the angle begins at the edge of the electronic chip and flows over an entirety of the surface of the electronic chip.

8. The cooling device of claim 1, wherein the accelerated stream of the coolant fluid is accelerated towards a fluid separator and the accelerated stream of the coolant fluid merges with an immersion coolant fluid in the immersion tank, the immersion coolant fluid flowing from side spacings that are between the server chassis and the server board.

9. The cooling device of claim 1, further comprising a pump coupled to the inlet port to pump the coolant fluid from the inlet port to the internal channel.

10. The cooling device of claim 8, wherein the coolant fluid is the immersion coolant fluid in the immersion tank, wherein the server chassis is submerged in the immersion coolant fluid.

11. A cooling system, comprising:
a server chassis housing a server board therein and the server chassis being configured to contain an immersion coolant fluid;
one or more cooling devices secured in the server chassis, wherein each of the one or more cooling devices comprises:
a frame structure containing an internal channel;
an inlet port coupled to the frame structure to receive a coolant fluid and to direct the coolant fluid to the internal channel;
one or more contactless cooling ports disposed on the frame structure at a predetermined distance from an electronic chip to accelerate a stream of the coolant fluid across a surface of the electronic chip to exchange heat from the electronic chip; and
a mounting structure secured to the frame structure, wherein the mounting structure is mounted to the server chassis or the server board housed in the server chassis,
wherein during operation, the server chassis is oriented with the inlet port near a bottom portion of an immersion tank and the accelerated stream of the coolant fluid rises to a top portion of the immersion tank.

12. The cooling system of claim 11, wherein the cooling device further comprises one or more fluid distributors coupled to the frame structure to receive the coolant fluid from the internal channel of the frame structure and the one or more contactless cooling ports is disposed on the one or more fluid distributors.

13. The cooling system of claim 12, wherein the one or more fluid distributors comprises a first fluid distributor and a second fluid distributor, and wherein the one or more cooling devices further comprises a fluid separator separating the first fluid distributor from the second fluid distributor segregating two of the accelerated stream of the coolant fluid.

14. The cooling system of claim 11, wherein the one or more cooling devices is mounted on the server chassis housing the server board, the server board having a plurality of the electronic chip disposed thereon.

15. The cooling system of claim 11, wherein the one or more contactless cooling ports directs the accelerated stream of the coolant fluid parallel to the surface of the electronic chip, wherein a cooling port of the one or more contactless cooling ports is disposed at a predetermined height and at a predetermined distance to an edge of the electronic chip such that the accelerated stream of the coolant fluid begins at the edge of the electronic chip and flows over an entirety of the surface of the electronic chip.

16. The cooling system of claim 11, wherein the one or more contactless cooling ports directs the stream of the coolant fluid at an angle substantially between 30 to 60 degrees to the surface of the electronic chip, wherein a cooling port of the one or more contactless cooling ports is disposed at a predetermined height and at a predetermined distance to an edge of the electronic chip such that the accelerated stream of the coolant fluid at the angle begins at the edge of the electronic chip and flows over an entirety of the surface of the electronic chip.

17. The cooling system of claim 11, wherein the accelerated stream of the coolant fluid is accelerated towards a fluid separator and the accelerated stream of the coolant fluid merges with the immersion coolant fluid in the immersion tank, the immersion coolant fluid flowing from side spacings that are between the server chassis and the server board.

18. An electronic rack, comprising:
a plurality of server chassis arranged in a stack, wherein each of the server chassis comprises:
a server board having one or more electronic devices mounted thereon, and
one or more cooling devices, wherein each of the one or more cooling devices comprises:
a frame structure containing an internal channel;
an inlet port coupled to the frame structure configured to receive a coolant fluid and to direct the coolant fluid to the internal channel;
one or more contactless cooling ports disposed on the frame structure at a predetermined distance from one of the one or more electronic devices to accelerate a stream of the coolant fluid across a surface of the one or more electronic devices to exchange heat from the one or more electronic devices; and a mounting structure secured to the frame structure, wherein the mounting structure is mounted to the server chassis or the server board, wherein during operation, at least one of the server chassis is oriented with the inlet port near a bottom portion of an immersion tank and the accelerated stream of the coolant fluid rises to a top portion of the immersion tank.

\* \* \* \* \*